(12) United States Patent
Maruyama et al.

(10) Patent No.: US 12,444,922 B2
(45) Date of Patent: Oct. 14, 2025

(54) POWER SUPPLY CIRCUIT HAVING PROTECTION CIRCUIT AGAINST ELECTROSTATIC DISCHARGE STRESS AND SEMICONDUCTOR DEVICE HAVING THE POWER SUPPLY CIRCUIT

(71) Applicants: Kabushiki Kaisha Toshiba, Tokyo (JP); Toshiba Electronic Devices & Storage Corporation, Tokyo (JP)

(72) Inventors: Tatsuhiko Maruyama, Kawasaki Kanagawa (JP); Toyoaki Uo, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 545 days.

(21) Appl. No.: 17/896,647

(22) Filed: Aug. 26, 2022

(65) Prior Publication Data

US 2023/0146002 A1 May 11, 2023

(30) Foreign Application Priority Data

Nov. 11, 2021 (JP) .................. 2021-184206

(51) Int. Cl.
*H02H 3/22* (2006.01)
(52) U.S. Cl.
CPC .................. *H02H 3/22* (2013.01)
(58) Field of Classification Search
CPC .. G05F 1/625; G05F 1/56; H02H 3/22; H02H 9/046; H01L 21/822; H01L 27/06; H03K 19/00; H03K 19/003; H02M 1/00
See application file for complete search history.

(56) References Cited

U.S. PATENT DOCUMENTS 7,319,575 B2   1/2008 Kawashimo et al.
9,400,515 B2   7/2016 Tomioka
(Continued)

FOREIGN PATENT DOCUMENTS

CN    102290806 A  * 12/2011
JP    2007180086 A * 7/2007
(Continued)

OTHER PUBLICATIONS

Japanese Office Action mailed Mar. 11, 2025 in related Japanese Patent Application 2021-184206 with English Translation, 6 pages.

*Primary Examiner* — Danny Nguyen
*Assistant Examiner* — Nicolas Bellido
(74) *Attorney, Agent, or Firm* — Kim & Stewart LLP

(57) ABSTRACT

According to the present embodiment, a power supply circuit includes a first transistor, a feedback voltage generation circuit, a first voltage generation circuit, and a protection circuit. The first transistor is connected between an input terminal and an output terminal. The feedback voltage generation circuit divides the output voltage to generate a feedback voltage. The first voltage generation circuit supplies a voltage to a first control terminal of the first transistor via a first node based on the feedback voltage and a reference voltage. The protection circuit outputs a voltage that makes the first transistor non-conducting or places the first transistor in a state where the first transistor has a predetermined high resistance value to the first control terminal, when the input voltage increases above a first threshold voltage within a predetermined time.

10 Claims, 10 Drawing Sheets

(56) References Cited

U.S. PATENT DOCUMENTS

| | | | |
|---|---|---|---|
| 9,671,802 B2 | 6/2017 | Sugiura | |
| 2001/0024140 A1* | 9/2001 | Taylor | G05F 1/56 |
| | | | 330/292 |
| 2010/0066320 A1* | 3/2010 | Dasgupta | G05F 1/56 |
| | | | 323/273 |
| 2010/0259235 A1* | 10/2010 | Ozalevli | G05F 1/56 |
| | | | 323/274 |
| 2014/0169038 A1* | 6/2014 | Kamath | H03D 3/00 |
| | | | 363/16 |
| 2016/0126238 A1* | 5/2016 | Tajima | H10D 89/814 |
| | | | 323/313 |
| 2016/0181924 A1* | 6/2016 | Sugiura | G05F 1/565 |
| | | | 323/271 |

FOREIGN PATENT DOCUMENTS

| | | | | |
|---|---|---|---|---|
| JP | 4669292 B2 * | 4/2011 | | H01L 27/0266 |
| JP | 2015-127902 A | 7/2015 | | |
| JP | 2016-118840 A | 6/2016 | | |
| JP | 2019-102822 A | 6/2019 | | |
| JP | 6629593 B2 | 1/2020 | | |

* cited by examiner

POWER SUPPLY CIRCUIT HAVING PROTECTION CIRCUIT AGAINST ELECTROSTATIC DISCHARGE STRESS AND SEMICONDUCTOR DEVICE HAVING THE POWER SUPPLY CIRCUIT

CROSS-REFERENCE TO RELATED APPLICATIONS

This application is based upon and claims the benefit of priority from the prior Japanese Patent Application No. 2021-184206, filed on Nov. 11, 2021 the entire contents of which are incorporated herein by reference.

FIELD

Embodiments of the preset invention relate to a power supply circuit and a semiconductor device.

BACKGROUND

A semiconductor device includes an electrostatic protection circuit for protecting internal circuits against electrostatic discharge (ESD) stress as measures against electrostatic discharge. However, when ESD stress transitioning at a high speed is applied, the electrostatic protection circuit may not perform its function, and the internal circuits may be damaged.

In a semiconductor device using a MOS transistor for I/O circuit and a high-speed MOS transistor, the MOS transistor for I/O circuit and the high-speed MOS transistor each have its unique manufacturing process. Therefore, bird's beak may be formed by oxidation treatment performed for the MOS transistor after the structure of the high-speed MOS transistor is processed, which results in deterioration of the characteristics of the high-speed MOS transistor.

DETAILED DESCRIPTION

According to the present embodiment, a power supply circuit includes a first transistor, a feedback voltage generation circuit, a first voltage generation circuit, and a protection circuit. The first transistor is connected between an input terminal and an output terminal. The feedback voltage generation circuit divides the output voltage to generate a feedback voltage. The first voltage generation circuit supplies a voltage to a first control terminal of the first transistor via a first node so that the output voltage matches or approximates to a set value based on the feedback voltage and a reference voltage. The protection circuit outputs a voltage that makes the first transistor non-conducting or places the first transistor in a state where the first transistor has a predetermined high resistance value to the first control terminal, when the input voltage increases above a first threshold voltage within a predetermined time.

Embodiments of the present invention will be explained below with reference to the drawings. In the following embodiments, while characteristic configurations and operations of a power supply circuit and a semiconductor device are mainly explained, the power supply circuit and the semiconductor device may include configurations and operations that are abbreviated in the following descriptions.

First Embodiment

Figure 1:
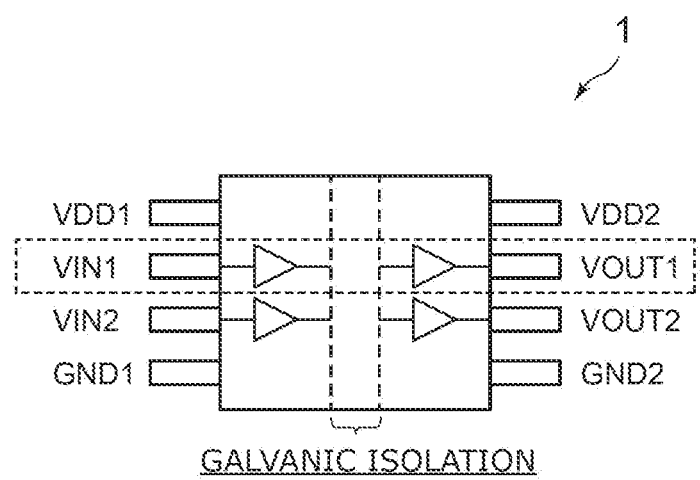
FIG. 1 is a schematic configuration diagram illustrating an example of an integrated circuit of a semiconductor device.

FIG. 1 is a schematic configuration diagram illustrating an example of an integrated circuit of a semiconductor device 1. The semiconductor device 1 is configured as an 8-pin integrated circuit, for example. As illustrated in FIG. 1, the semiconductor device 1 is an example of a 2-channel digital isolator using, for example, galvanic isolation. In the semiconductor device 1, a primary side and a secondary side each have a pin arrangement including a power supply and GND. Further, the semiconductor device 1 is a chip that uses two or more breakdown voltage levels including a high breakdown voltage for external I/F and a low breakdown voltage for internal elements. For example, 5 volts is used as the high breakdown voltage for external I/F, and 1.5 volts is used as the low breakdown voltage for internal elements.

This digital isolator outputs an input signal input to a signal input terminal VIN1 on the primary side, as an output signal from a signal output terminal VOUT1 on the secondary side via a transformer isolated by galvanic isolation. For example, when a logic signal "1" is input to the signal input terminal VIN1, the modulated signal passes through the transformer isolated by galvanic isolation and is demodulated, so that the logic signal "1" is output from the signal output terminal VOUT1. Although the digital isolator is used and described as a configuration example of the semiconductor device 1 in the present embodiment, the semiconductor device 1 is not limited thereto. For example, the present embodiment can be also applied to a configuration in a semiconductor device other than the digital isolator, as long as the configuration is a circuit requiring a protection function against ESD stress.

Figure 2:
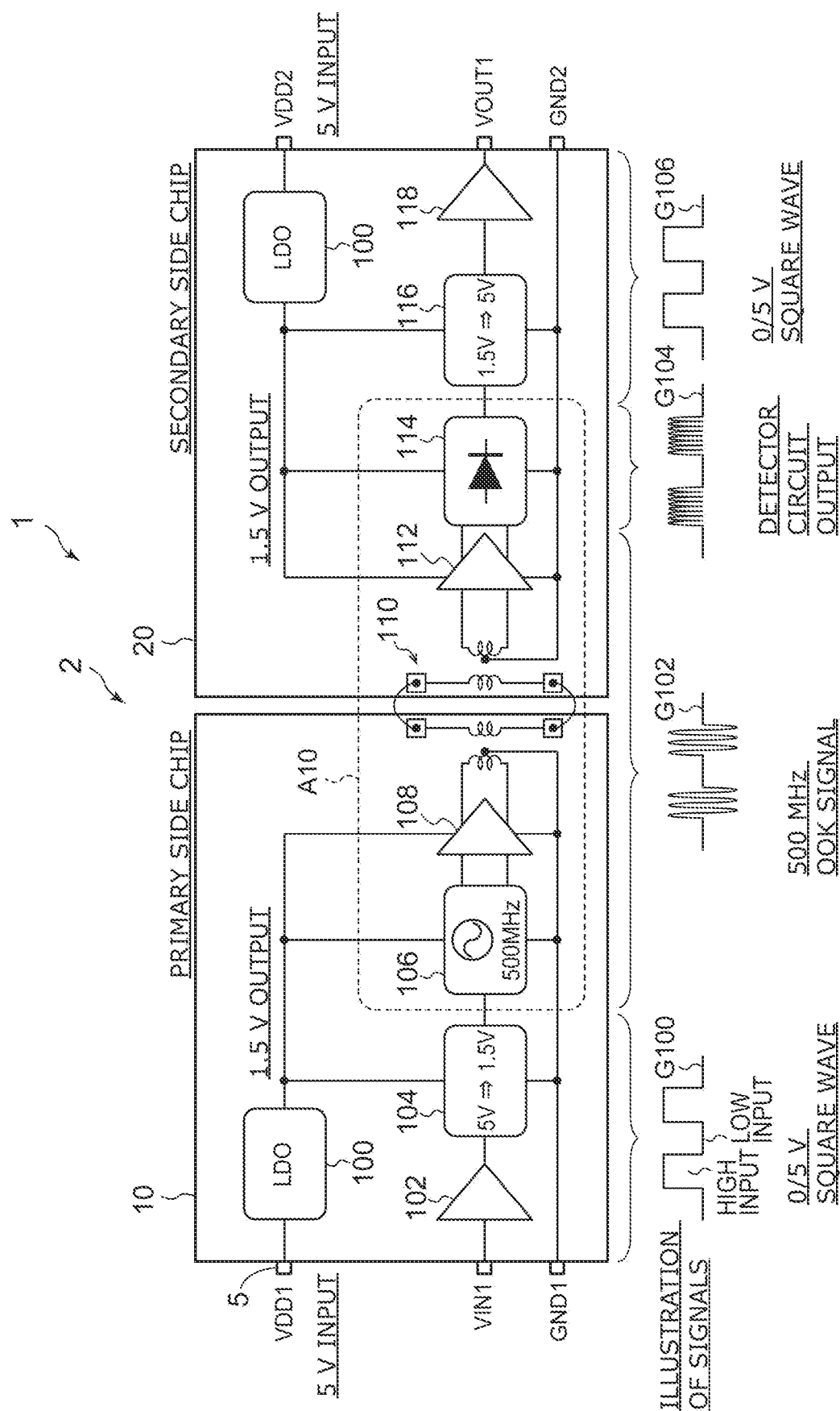
FIG. 2 is a block diagram illustrating a configuration example of a digital isolator for one channel.

FIG. 2 is a block diagram illustrating a configuration example of a digital isolator 2 for one channel illustrated in FIG. 1. As illustrated in FIG. 2, the digital isolator 2 is configured by a primary side chip 10 and a secondary side chip 20 that are isolated by galvanic isolation. The digital isolator 2 includes a plurality of power supply circuits 100, an input buffer 102, a first level shifter 104, a modulator 106, a driving circuit (DRV) 108, a transformer 110, an amplifier (RF Amp) 112, a detector circuit 114, a second level shifter 116, and an output buffer 118.

The lower part of FIG. 2 schematically illustrates signals output from some of the circuits. The vertical axis represents a signal level and the horizontal axis represents a time.

Signals G100 to G106 correspond to one another. That is, FIG. 2 illustrates how the signal G100 changes in time series as the signals G102 to G106. More specifically, the signal G100 represents an example of a square-wave logic signal input to the input buffer 102 from the signal input terminal VIN1. A high input of 5 volts, for example, corresponds to "1", and a low input of 0 volt, for example, corresponds to "0".

The signal G102 represents a 500 MHz on-off keying (OOK) signal output from the driving circuit 108. The signal G104 represents a detector circuit signal output from the detector circuit 114. The signal G106 represents an example of a square-wave logic signal output from the output terminal VOUT1. A high input of 5 volts (V), for example, corresponds to "1", and a low input of 0 volt, for example, corresponds to "0".

As illustrated in FIG. 2, a high-speed circuit block A10 has to be operated at a high speed, and is therefore configured by a MOS (metal-oxide-semiconductor) element that can be operated at a high speed. Since the high-speed MOS element has a low breakdown voltage, the power supply circuit 100 regulates an external voltage (Vdd1 or Vdd2) of, for example, 5 volts to a lower voltage of, for example, 1.5 volts and supplies it to the high-speed circuit block A10. As described above, the high-speed circuit block A10 has a lower breakdown voltage than a circuit in another region and therefore has vulnerability against electrostatic discharge. Therefore, in the present embodiment, the power supply circuit 100 is configured to include a protection circuit in order to protect each circuit in the high-speed circuit block A10 against ESD stress such as electrostatic discharge. By this configuration, transmission of overvoltage or the like from the power supply circuit 100 to the high-speed circuit block A10 is prevented, even when ESD stress such as electrostatic discharge or a power-supply voltage rising in a short time, for example, 20 nanoseconds (nsec), which is generated at starting up of a power supply supplying power to a VDD1 terminal, is applied to the semiconductor device 1. Details of the power supply circuit 100 will be described later.

The square-wave logic signal G100, for example, is input to the input buffer 102. The logic signal G100 is, for example, a 150 Mbps (megabits per second) square wave signal. The input buffer 102 outputs the square-wave logic signal G100 to the first level shifter 104, while maintaining the waveform of the square wave. In addition, the input buffer 102 may have hysteresis characteristics in order to provide immunity to noise at signal transition.

The first level shifter 104 changes the amplitude of the logic signal G100. For example, the first level shifter 104 converts a 5-volt square wave that is a high input to a 1.5-volt square wave.

The modulator 106 includes an oscillator, generates the on-off keying signal G102 that is a high-frequency differential signal in accordance with the square wave signal input from the first level shifter 104, and outputs the on-off keying signal G102 to the driving circuit 108. The on-off keying signal G102 is a signal obtained by putting a modulation signal on a 500-megahertz carrier wave. Although a 500-megahertz carrier wave is used in the present embodiment, the carrier wave to be used is not limited thereto. For example, a carrier wave with a frequency of hundreds megahertz to several gigahertz (GHz) may be generated. Further, the frequency of the carrier wave may be modulated as in a spread spectrum technique.

The driving circuit 108 drives the transformer 110 to transmit the 500-MHz on-off keying signal G102 described before to the secondary side chip 20. The transformer 110 transmits the on-off keying signal G102 to the secondary side chip 20 while ensuring galvanic isolation. The transformer 110 according to the present embodiment includes two transformers, thereby enhancing the isolation performance and improving the safety of the isolation performance. A configuration including one transformer may be employed depending on the application, for example, in a case where the isolation performance is not required so much. Furthermore, galvanic isolation uses a magnetic coupling method using a transformer in the semiconductor device 1 according to the present embodiment, but the method of galvanic isolation is not limited thereto. For example, galvanic isolation may employ an electric field coupling method using a capacitor or an optical coupling method. In addition, although an on-off keying signal is transmitted in the semiconductor device 1 according to the present embodiment, what is transmitted is not limited thereto. For example, a frequency modulation method, an edge modulation method that transmits edge information of an input signal, or a method of transmitting a signal obtained by combining those methods may be employed.

The amplifier 112 amplifies an input signal from the transformer 110 and outputs it to the detector circuit 114. The detector circuit 114 detects the on-off keying signal that is a differential signal input thereto, outputs the detector circuit output G104, converts it to a 1.5-volt square wave, and outputs the square wave to the second level shifter 116.

The second level shifter 116 converts the 1.5 to 0-volt square wave to the logic signal G106 that is a 5 to 0-volt square wave, and outputs it to the output buffer 118. The output buffer 118 outputs the logic signal G106 from the output terminal VOUT1, while maintaining the waveform of the square wave. As described above, the digital isolator 2 modulates the logic signal G100 input to the signal input terminal VIN1 and outputs the demodulated logical signal G106 from the signal output terminal VOUT1, while galvanic isolation between the primary side chip 10 and the secondary side chip 20 is maintained. The configuration of the digital isolator 2 described above is merely an example, and is not limited to this circuit configuration.

Figure 3:
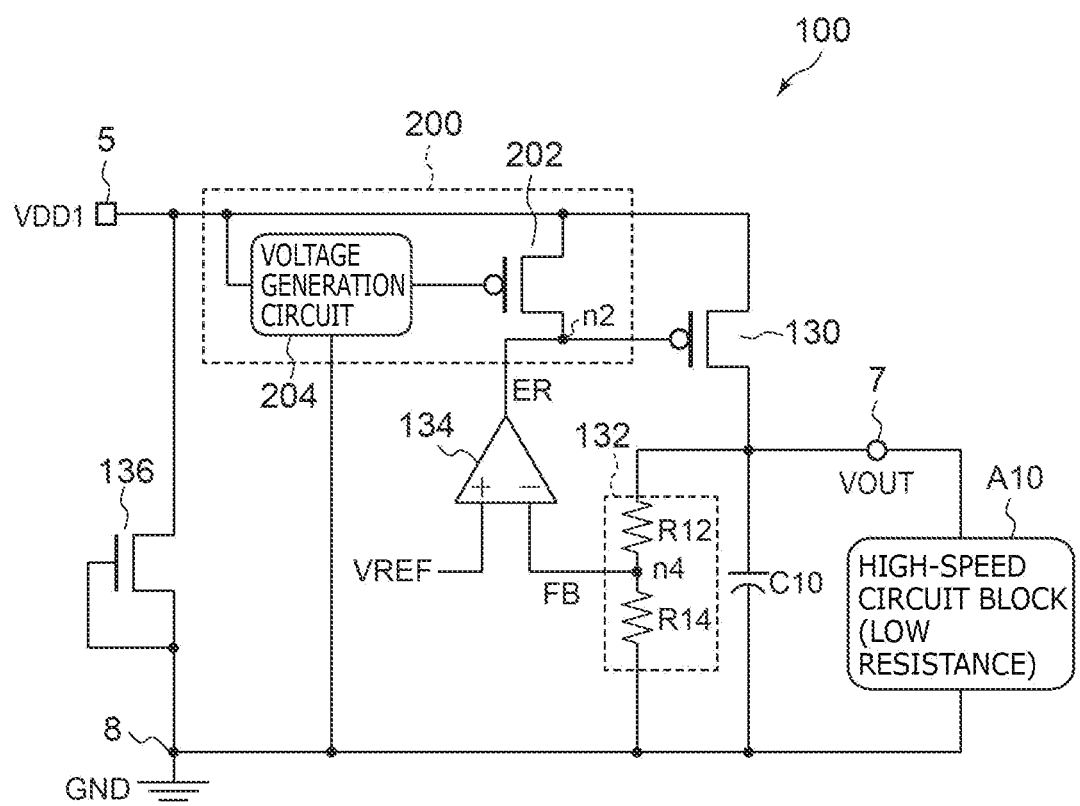
FIG. 3 is a circuit diagram illustrating a configuration example of a power supply circuit.

FIG. 3 is a circuit diagram illustrating a configuration example of the power supply circuit 100. As illustrated in FIG. 3, the power supply circuit 100 is, for example, a low dropout regulator (LDO) and includes a first transistor 130, an output capacitor C10, a feedback voltage generation circuit 132, an error amplifier 134, an electrostatic protection circuit 136, and a protection circuit 200. The error amplifier 134 according to the present embodiment corresponds to a first voltage generation circuit, and the electrostatic protection circuit 136 corresponds to a fourth transistor.

The protection circuit 200 outputs a control voltage that makes the first transistor 130 non-conducting or places the first transistor 130 in a state where the first transistor 130 has a predetermined high resistance value, when a voltage input to a VDD1 terminal 5 increases above a first threshold Vthm (see FIG. 5A described later) within a predetermined time. This high resistance value is a value of resistance that reduces a potential between a VOUT output node 7 and a GND terminal 8 to a breakdown voltage of a high-speed MOS element or lower, for example, when ESD stress is applied to the VDD1 terminal 5. In other words, a control voltage is set to achieve a high resistance value that corresponds to expected ESD stress. The protection circuit 200 includes a second transistor 202 and a voltage generation circuit 204. Details of the protection circuit 200 will be described later with reference to FIG. 4. The voltage generation circuit 204 according to the present embodiment corresponds to a second voltage generation circuit, and the VOUT output node 7 corresponds to an output terminal.

As illustrated in FIG. 3, the first transistor 130 is provided between the VDD1 terminal 5 and the VOUT output node 7 in the power supply circuit 100. The first transistor 130 is, for example, a PMOS (p-Channel Metal-Oxide Semiconductor) transistor in which a source is connected to the VDD1 terminal 5, a drain is connected to the VOUT output node 7, and a gate is connected to a node n2. The node n2 according to the present embodiment corresponds to a first node.

The high-speed circuit block A10 as a load is connected between the VOUT output node 7 and the GND terminal 8. Similarly, the output capacitor C10 and the feedback voltage generation circuit 132 are connected in parallel to the high-speed circuit block A10 between the VOUT output node 7 and the GND terminal 8.

The feedback voltage generation circuit 132 has two resistors R12 and R14 connected to each other in series between the VOUT output node 7 and the GND terminal 8. The feedback voltage generation circuit 132 generates a divided voltage that is in proportion to an output voltage Vout, as a feedback voltage FB from a node n4 between the resistors R12 and R14.

A direct-current voltage Vdd of, for example, 5 volts is input to the VDD1 terminal 5 from a battery, a storage battery, or another direct-current power supply (not illustrated). A voltage corresponding to the set output voltage Vout, for example, 1.5 volts is set as a reference voltage VREF.

An inverting input terminal of the error amplifier 134 is connected to the node n4. The feedback voltage FB is thus input to the inverting input terminal. Meanwhile, the reference voltage VREF is input to a non-inverting input terminal. An output terminal of the error amplifier 134 is connected to the gate of the first transistor 130 which is a control terminal. Accordingly, the error amplifier 134 amplifies an error between the reference voltage VREF and the feedback voltage FB and outputs a voltage ER in accordance with the error to the control terminal (gate) of the first transistor 130. A source-drain resistance of the first transistor 130 changes with the voltage ER applied to the gate. Accordingly, a source-drain voltage of the first transistor 130 is adjusted by the voltage ER applied to the gate. Further, the output voltage Vout is stabilized to a target value of Vout=VREF× (R12+R14)/R14 by feedback control by the error amplifier 134. That is, the reference voltage VREF and the resistance values of the resistors R12 and R14 are set to make Vout equal to 1.5 volts.

The power supply circuit 100 is provided with the electrostatic protection circuit 136. The electrostatic protection circuit 136 is connected between the VDD1 terminal 5 and the GND terminal 8. The GND terminal 8 is a potential terminal for a potential lower than a potential Vdd applied to the VDD1 terminal 5, and that lower potential is set to, for example, 0 V.

For example, the electrostatic protection circuit 136 snaps back when the voltage input to the VDD1 terminal 5 exceeds a predetermined snapback voltage Vs (see FIG. 5A described later). Therefore, the impedance of the VDD1 terminal 5 and the GND terminal 8 is reduced, so that the electrostatic protection circuit 136 becomes a path for an ESD current.

The electrostatic protection circuit 136 is, for example, an electrostatic protection transistor connected between the VDD1 terminal 5 and the GND terminal 8. In more detail, the electrostatic protection transistor is, for example, an NMOS (n-Channel Metal-Oxide Semiconductor) transistor and is a so-called "ggNMOS (Grounded Gate NMOS) transistor" in which a gate and a source are connected to the GND terminal 8. Alternatively, this electrostatic protection transistor is, for example, a PMOS (p-Channel Metal-Oxide Semiconductor) transistor and is a so-called "sgPMOSFET (Source connected Gate PMOSFET)" in which a gate and a source are connected to the GND terminal 8. The following description refers to the ggNMOS transistor as an example, and the description of an operation example of the sgPMOS-FET is omitted because the sgPMOSFET operates in an identical manner.

In the electrostatic protection circuit 136, when electrostatic discharge is applied to the VDD1 terminal 5, a substrate potential rises due to an avalanche current generated by avalanche breakdown at a drain end of the NMOS transistor, so that a parasitic bipolar device operates. By the operation of the parasitic bipolar device, a low-impedance current path is formed between the drain and the source of the NMOS transistor, and a current caused by electrostatic discharge or the like flows. Consequently, a circuit connected between the VDD1 terminal 5 and the GND terminal 8, for example, is protected.

Figure 4:
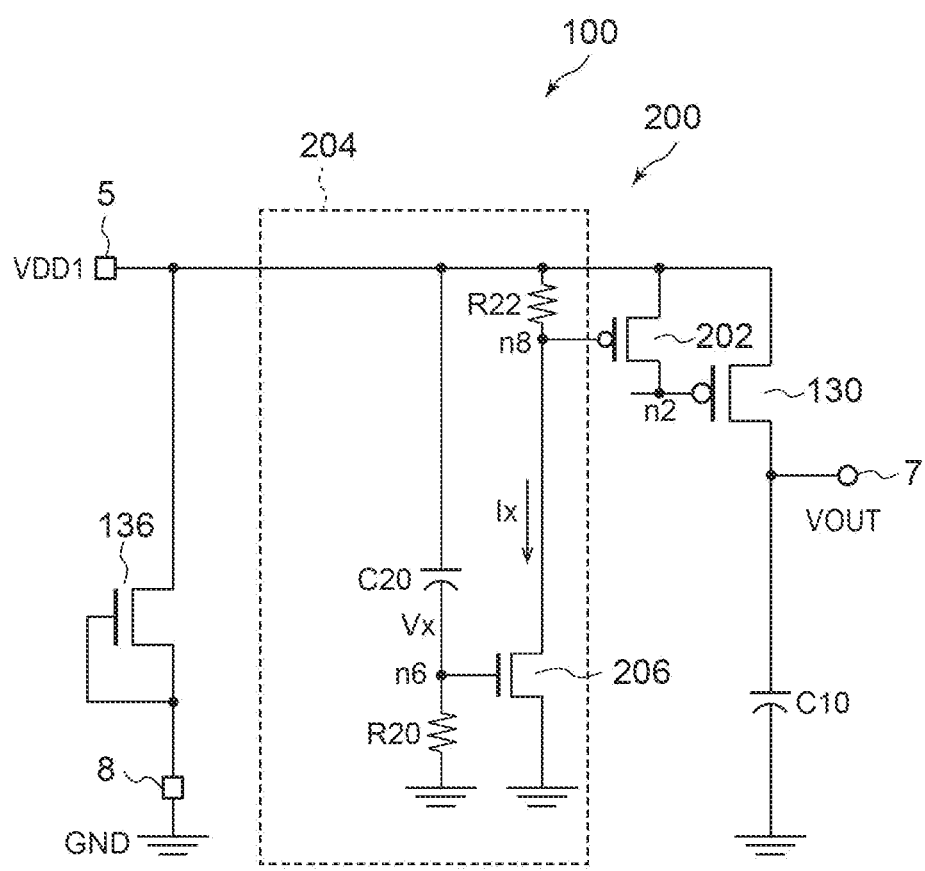
FIG. 4 is a circuit diagram illustrating a configuration example of a protection circuit.

FIG. 4 is a circuit diagram illustrating a configuration example of the protection circuit 200. As illustrated in FIG. 4, the protection circuit 200 includes the second transistor 202 and the voltage generation circuit 204. The second transistor 202 is, for example, a PMOS transistor in which a source is connected to the VDD1 terminal 5 and a drain is connected to a gate of the first transistor 130 which is the control terminal. Since the first transistor 130 is, for example, a PMOS transistor, the resistance of the first transistor 130 increases when a drain voltage of the second transistor 202 increases in the positive direction. Thereafter, the first transistor 130 is turned off when the drain voltage of the second transistor 202 exceeds a predetermined threshold voltage.

The voltage generation circuit 204 controls the voltage of a gate of the second transistor 202 which serves as a control terminal in accordance with an input voltage of the VDD1 terminal 5. For example, when a positive surge voltage is applied to the VDD1 terminal 5 and exceeds a first threshold Vthm (see FIG. 5A), the voltage generation circuit 204 applies a control voltage placing the second transistor 202 in a conducting state or reducing the resistance of the second transistor 202 to a predetermined low resistance close to that in the conducting state, to the control terminal of the second transistor 202. When the second transistor 202 becomes conducting or is made to have the predetermined low resistance close to that in the conducting state, the drain voltage of the second transistor 202 becomes the voltage Vdd of the VDD1 terminal 5, or becomes closer to the voltage Vdd of the VDD1 terminal 5. The positive surge voltage can include not only electrostatic discharge but also a voltage at starting up of an input power supply of the VDD1 terminal 5. The voltage generation circuit 204 is configured to be able to output the control voltage in response to ESD stress that steeply rises in a time equal to or shorter than 20 nanoseconds, for example.

More specifically, the voltage generation circuit 204 includes a first capacitor C20, a first resistor R20, a second resistor R22, and a third transistor 206. The first capacitor C20 is connected between the VDD1 terminal 5 and a node n6. The first capacitor C20 has an electrostatic capacitance of 2 picofarads (pF), for example. The node n6 according to the present embodiment corresponds to a second node.

The first resistor R20 is connected between the GND terminal 8 and the node n6. The first resistor R20 has a resistance of 30 kiloohms (kW), for example. The combination of the first capacitor C20 and the first resistor R20 can be set in accordance with a transition state at starting up of the input power supply of the VDD1 terminal 5 or ESD stress by electrostatic discharge, for example.

The third transistor 206 is, for example, an NMOS transistor in which a drain is connected to a node n8 and a source is connected to the GND terminal 8. A gate of the third transistor 206, serving as a control terminal, is connected to the node n6. The node n8 according to the present embodiment corresponds to a third node. One end of the second resistor R22 is connected to the node n8, and the other end is connected to the VDD1 terminal 5.

A second element is described here. The second element may be called "dummy element". In a manufacturing process of a transistor, variation in characteristics may become large because of influences of the pattern density and a device arranged near the transistor. Therefore, a plurality of second elements are arranged in an end region or an adjacent region of a region where NMOS transistors or PMOS transistors as a plurality of first elements are provided. As described above, an integrated circuit, for example, is configured by a first element group including the first elements and a second element group including the second elements arranged to be closer to an end of the integrated circuit than the first element group. The second element group includes elements arranged for reducing the variation in characteristics in the manufacturing process of the NMOS transistor or the PMOS transistor, for example, and is arranged to be closer to the end of the integrated circuit than the first element group as described above. In other words, in a manufacturing process of the second element, it is difficult to make the influences from the surroundings uniform during formation of the second element. Therefore, the performance varies more in the second element as compared with the first element.

The second transistor 202 and the third transistor 206 according to the present embodiment do not require precision, because they operate as switches and therefore perform a digital operation. For this reason, a condition for controlling the operations of the second transistor 202 and the third transistor 206 can be satisfied even when the second element is used as the second and third transistors. Further, the amount of current made to flow in the second element is also smaller than that in the first element, and the area of the second element can be also made smaller. That is, the second elements that originally serve as dummy elements to which wires are not connected can be used as the second transistor 202 and the third transistor 206 according to the present embodiment, with wires connected thereto. As described above, these second elements are arranged to be closer to the end of the integrated circuit in which the first transistor 130 is provided than the first transistor 130. For example, the second elements are arranged at the end of the integrated circuit in which the first transistor 130 is provided. Accordingly, the semiconductor device 1 can be further miniaturized.

A configuration example of the semiconductor device 1 is as described above. Next, an operation example of the electrostatic protection circuit 136 and the protection circuit 200 is described with reference to FIGS. 5A to 5C, referring also to FIGS. 3 and 4. FIGS. 5A to 5C are explanatory diagrams of an operation example of the electrostatic protection circuit 136 and the protection circuit 200. In FIG. 5A, the horizontal axis represents a time, and the vertical axis represents a positive surge voltage as the voltage Vdd input to the VDD1 terminal 5. In FIG. 5B, the horizontal axis represents a time, and the vertical axis represents a voltage Vx of the node n6 (see FIG. 4). In FIG. 5C, the horizontal axis represents a time, and the vertical axis represents a current Ix flowing to the node n8 (see FIG. 4). An interval between a time t0 and a time t1 is, for example, 20 nanoseconds.

Figure 5:
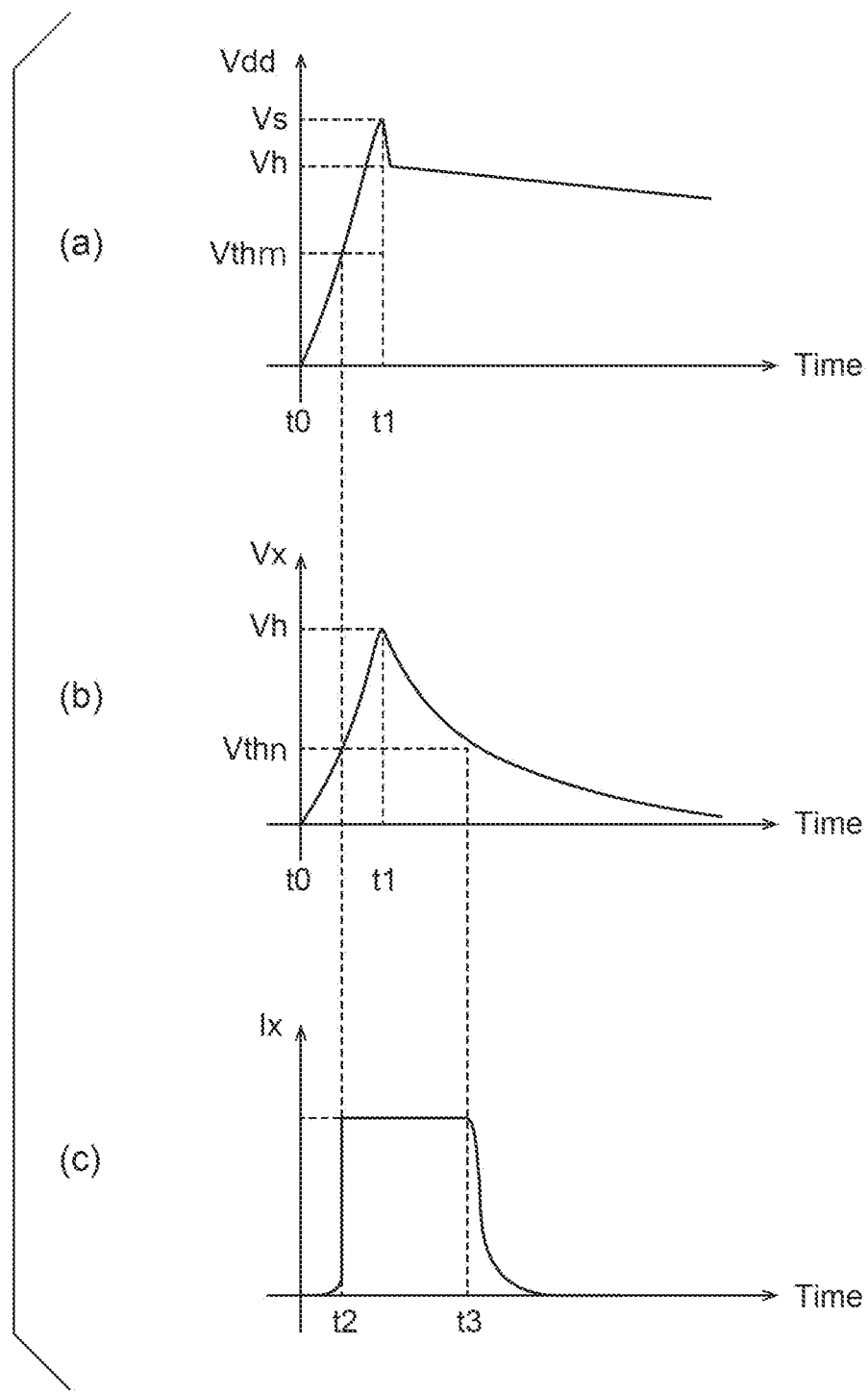
FIG. 5 are explanatory diagrams of an operation example of an electrostatic protection circuit and the protection circuit.

An example is described here in which electrostatic discharge is applied as a positive surge voltage (an ESD voltage) at the time t0 as illustrated in FIG. 5A. When the positive surge voltage is applied between the VDD1 input terminal 5 and the GND terminal 8, the voltage Vdd steeply rises. Thereafter, when the voltage Vdd reaches the snapback voltage Vs of a ggNMOS transistor in the electrostatic protection circuit 136 at the time t1, a parasitic bipolar device of the ggNMOS transistor operates, and the voltage Vdd becomes a hold voltage Vh, so that an ESD current is allowed to flow. The first threshold voltage Vthm is a threshold voltage in which when the voltage Vdd exceeds the first threshold voltage Vthm, the first transistor 130 is placed in a non-conducting state or in a state where the first transistor 130 has a predetermined high resistance value.

When the ESD current flows, the voltage Vdd falls slowly. In the present embodiment, a voltage that is applied between the VDD1 input terminal 5 and the GND terminal 8 due to electrostatic discharge and steeply rises may be called "ESD stress". An example of the ESD stress applied to the semiconductor device 1 on a trial basis is a human body model (HBM). FIG. 5A illustrates an example in which a human body model of 2 kilovolts (kV), for example, is applied as the positive surge voltage.

At this time, as illustrated in FIG. 5B, the voltage Vx of the node n6 (see FIG. 4) steeply rises with steep rise of the voltage Vdd in accordance with the transition characteristics of the first capacitor C20 (see FIG. 4) and the first resistor R20 (see FIG. 4), and exceeds a first voltage Vthn that is a threshold voltage of the third transistor 206 at a time t2. The first voltage Vthn is a voltage corresponding to the first threshold voltage Vthm. The voltage Vx continues to rise with rise of the voltage Vdd, and reaches the hold voltage Vh at the time t1. When rise of the voltage Vx ends, the voltage Vx decreases with a time constant of 60 nanoseconds (in a case where the capacitance of the first capacitor C20 is 2 picofarads and the resistance of the first resistor R20 is 30 kiloohms), and then falls below the threshold voltage Vthn of the third transistor 206 at a time t3. It suffices that the time constant is designed to 20 nanoseconds or longer within which ESD (HBM) rises. An operation is performed with a relatively small time constant. In addition, since the time constant is relatively small, the capacitance and the resistance can be designed to be small.

At this time, as illustrated in FIG. 5C, since the voltage Vx exceeds the first voltage Vthn that is the threshold voltage from the time t2 to the time t3, the current Ix flows between the source and the drain of the third transistor 206. This current is limited by the voltage Vdd/the first resistance R20. For example, when the hold voltage Vh is 10 volts and the second resistance R22 is 10 kiloohms, the current Ix is 1 milliampere (mA). Therefore, a large amount of current does not flow in the third transistor 206, so that the risk of damage is reduced.

In addition, because of voltage drop by the current Ix and the second resistance R22, a gate potential of the second transistor 202 decreases, so that the second transistor 202 becomes conducting (is turned on). Further, when the second transistor 202 becomes conducting (is turned on), the voltage Vdd or a voltage close to the voltage Vdd is applied to the gate of the first transistor 130 as described above, so that the first transistor 130 becomes non-conducting (is turned off) or has a resistance value close to that in a non-conducting state. An example of a simulated voltage of the VOUT output node 7 after the first transistor 130 becomes non-conducting (is turned off) or has a resistance value close to that in the non-conducting state will be described later with reference to FIG. 6. In addition, since both the second transistor 202 and the third transistor 206 flow a small amount of current and perform a switching operation as described above, it is possible to reduce the area of the power supply circuit 100 by using the second element and the like.

Figure 6:
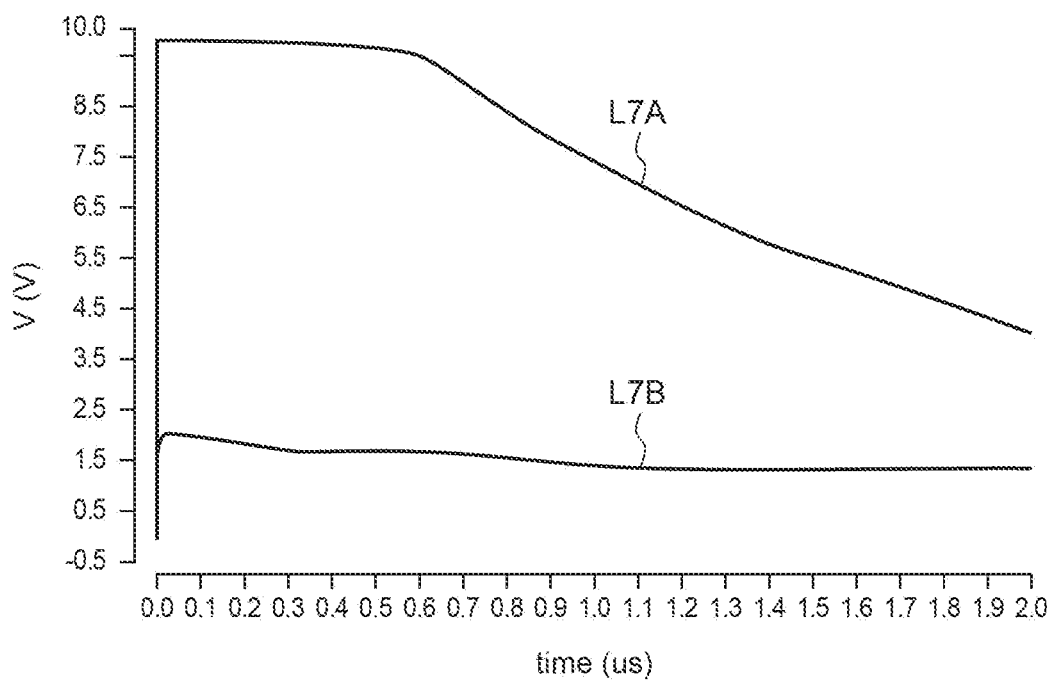
FIG. 6 is a diagram illustrating simulation results.

FIG. 6 is a diagram illustrating simulation results when a positive surge voltage (an ESD voltage) of 2 kilovolts is applied between the VDD1 input terminal 5 and the GND terminal 8. The horizontal axis represents a time and the vertical axis represents a voltage.

A line L7A represents the voltage Vdd, and a line L7B represents a voltage of the VOUT output node 7. As illustrated in FIG. 6, even when the voltage Vdd steeply changes, the voltage of the VOUT output node 7 is suppressed to 2 volts or lower. That is, when the second transistor 202 becomes conducting (is turned on), the voltage Vdd is applied to a gate of the first transistor 130, and the first transistor 130 becomes non-conducting (is turned off) or has a resistance value close to that in a non-conducting state as described above. Consequently, the voltage of the VOUT output node 7 is suppressed to 2 volts or lower. As is apparent from this description, even when a positive surge voltage (an ESD voltage) is applied as ESD stress, a voltage applied to a circuit or the like in the high-speed circuit block A10 does not exceed a breakdown voltage, and the circuit or the like is protected.

Figure 7:
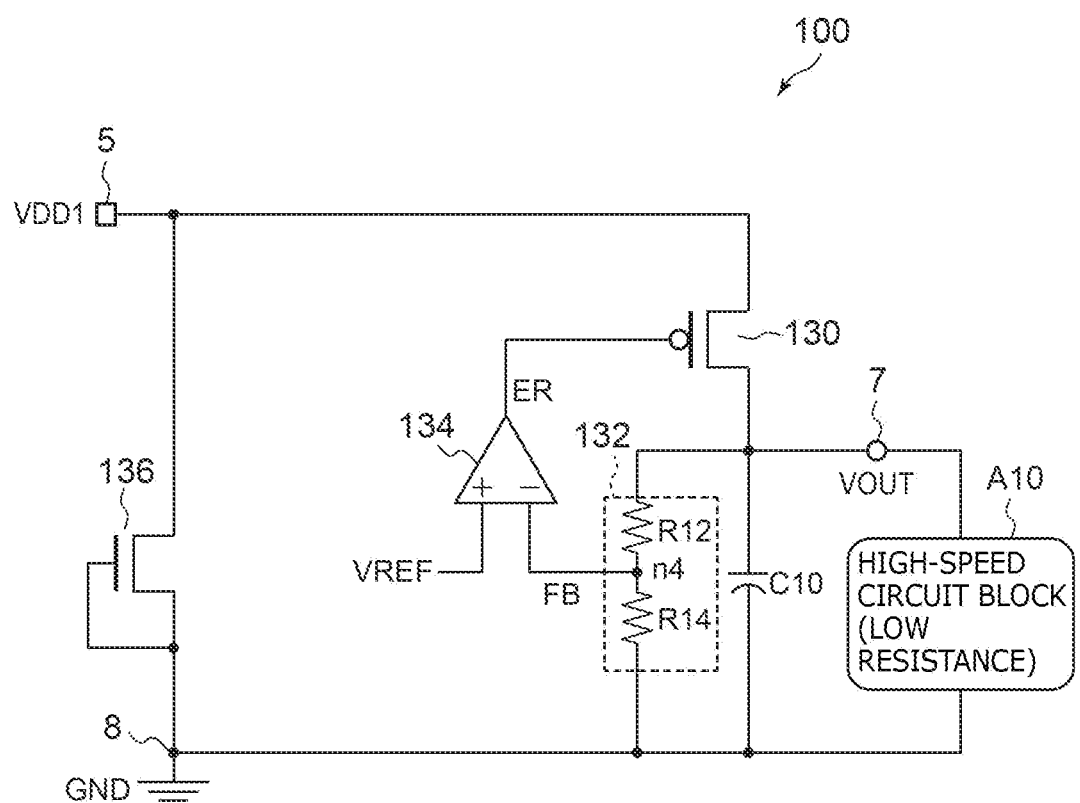
FIG. 7 is a circuit diagram illustrating a configuration example of a power supply circuit according to a comparative example.

FIG. 7 is a circuit diagram illustrating a configuration example of the power supply circuit 100 according to a comparative example. As illustrated in FIG. 7, the power supply circuit 100 of the comparative example does not include the protection circuit 200.

Figure 8:
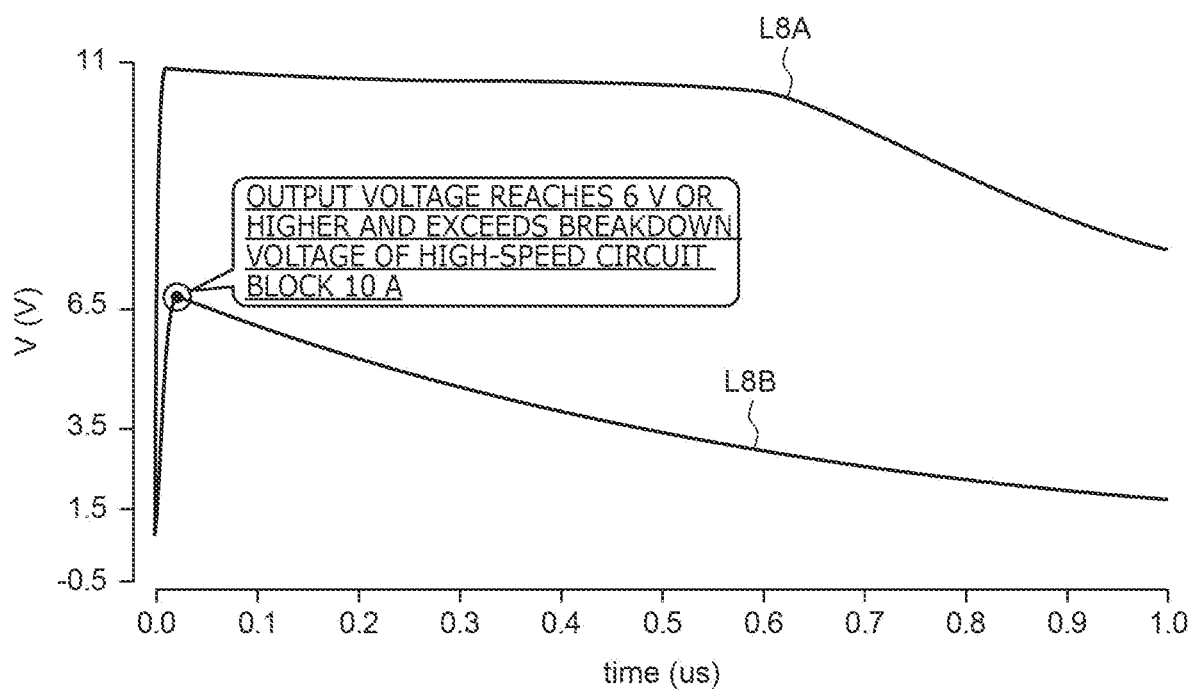
FIG. 8 is a diagram illustrating simulation results as a comparative example.

FIG. 8 is a diagram illustrating simulation results for the power supply circuit 100 illustrated in FIG. 7 as a comparative example. The simulation results are obtained when a positive surge voltage (an ESD voltage) of 2 kilovolts is applied between the VDD1 input terminal 5 and the GND terminal 8. The horizontal axis represents a time, and the vertical axis represents a voltage. A line L8A represents the voltage Vdd, and a line L8B represents a voltage of the VOUT output node 7. As illustrated in FIG. 8, an initial value of a gate voltage of the first transistor 130 is 0 in the power supply circuit 100 not including the protection circuit 200. The bandwidth of the error amplifier 134 is several MHz. Therefore, when a voltage of the VDD1 terminal 5 steeply changes, the first transistor 130 is turned on, and therefore the voltage of the VOUT output node 7 rises to 6 V or higher. Consequently, a voltage applied to a circuit or the like in the high-speed circuit block A10 exceeds a breakdown voltage, and the circuit may be damaged.

As described above, in the semiconductor device 1 according to the present embodiment, the protection circuit 200 outputs a voltage that makes the first transistor 130 non-conducting or makes the first transistor 130 have a resistance value that brings the first transistor 130 close to a non-conducting state, to a control terminal of the first transistor 130 when a voltage input to the VDD1 terminal 5 increases above the first threshold Vthn within a predetermined time. Accordingly, even when a positive surge voltage (an ESD voltage) or the like which exceeds the first threshold Vthn within the predetermined time is applied, a voltage of the VOUT output node 7 to which one end of the first transistor 130 is connected can be suppressed to a predetermined value or lower. Consequently, a voltage applied to a circuit or the like in the high-speed circuit block A10 does not exceed a breakdown voltage, and the circuit or the like is protected.

Second Embodiment

The semiconductor device 1 according to a second embodiment is different from the semiconductor device 1 according to the first embodiment in that the protection circuit 200 further includes a transistor that makes a voltage of the VOUT output node 7 equal to a GND potential. In the following descriptions, different points from the semiconductor device 1 according to the first embodiment are explained.

Figure 9:
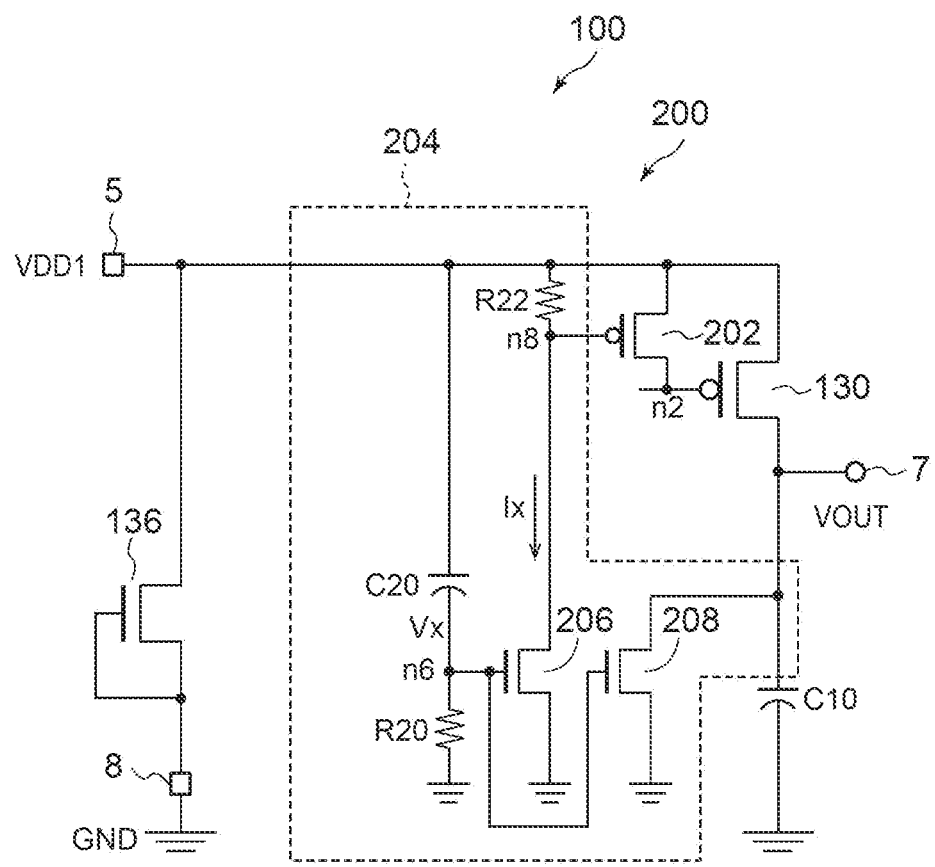
FIG. 9 is a circuit diagram illustrating a configuration example of a protection circuit according to a second embodiment.

FIG. 9 is a circuit diagram illustrating a configuration example of the protection circuit 200 according to the second embodiment. As illustrated in FIG. 9, this protection circuit 200 is different from the protection circuit 200 according to the first embodiment in that the voltage generation circuit 204 further includes a fifth transistor 208.

The fifth transistor 208 is an element identical to the third transistor 206, and is an NMOS transistor with a threshold voltage Vthn in which a drain is connected to the VOUT output node 7 and a source is connected to the GND terminal 8. A gate of the fifth transistor 208 which serves as a control terminal is connected to the node n6.

With this configuration, as illustrated in FIG. 5B described above, the voltage Vx of the node n6 rises with steep rise of the voltage Vdd in accordance with the transition characteristics of the first capacitor C20 and the first resistor R20, and exceeds the threshold voltage Vthn of the fifth transistor 208 at the time t2. When rise of the voltage Vx ends, the voltage Vx decreases and falls below the threshold voltage Vthn of the fifth transistor 208 at the time t3. The fifth transistor 208 is thus conducting from the time t2 to the time t3. Therefore, a potential at the VOUT output node 7 is the same as a potential at the GND terminal 8 from the time t2 to the time t3. As is apparent from this description, the potential at the VOUT output node 7 can be made closer to the potential at the GND terminal 8 from the time t2 to the time t3, as compared with the circuit configuration in FIG. 4. Therefore, from the time t2 to the time t3, a voltage applied to a circuit or the like in the high-speed circuit block A10 does not exceed a breakdown voltage, and the circuit or the like is protected more stably.

Third Embodiment

The semiconductor device 1 according to a third embodiment is different from the semiconductor device 1 according to the first embodiment in that the voltage generation circuit 204 is configured by a resistor and a capacitor connected in series. In the following descriptions, different points from the semiconductor device 1 according to the first embodiment are explained.

Figure 10:
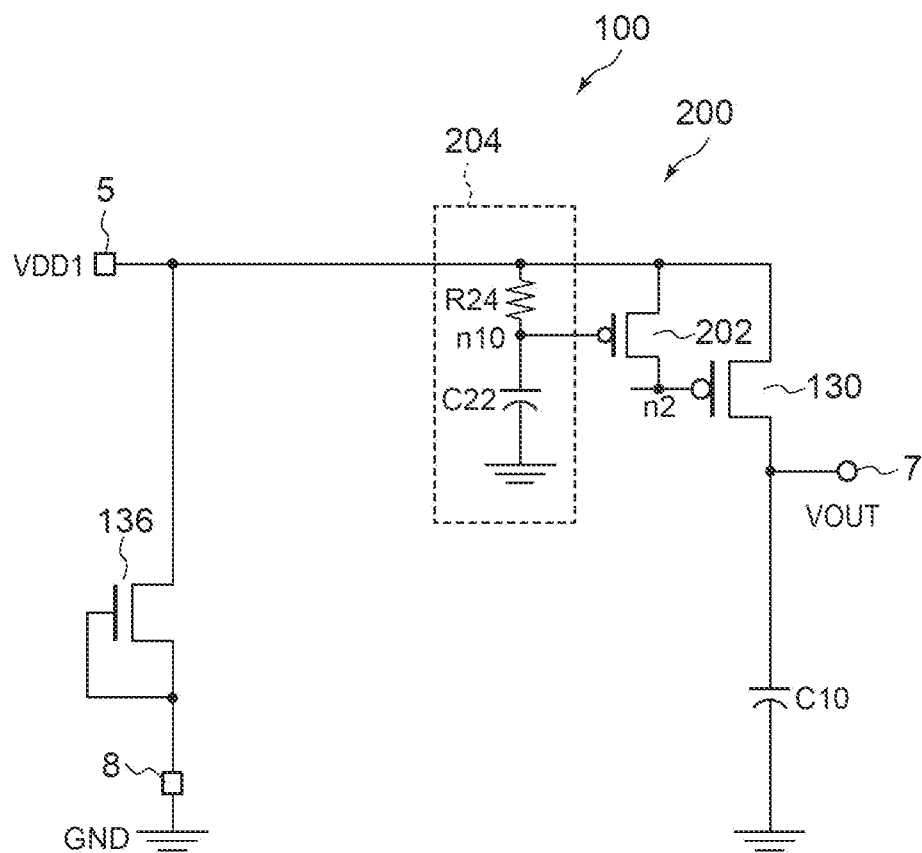
FIG. 10 is a circuit diagram illustrating a configuration example of a protection circuit according to a third embodiment.

FIG. 10 is a circuit diagram illustrating a configuration example of the protection circuit 200 according to the third embodiment. As illustrated in FIG. 10, this protection circuit 200 is different from the protection circuit 200 according to the first embodiment in that the voltage generation circuit 204 is configured by a third resistor R24 and a second capacitor C22.

One end of the third resistor R24 is connected to the VDD1 input terminal 5, and the other end is connected to a node n10. One end of the second capacitor C22 is connected to the node n10, and the other end is connected to the GND terminal 8. The node n10 according to the present embodiment corresponds to a fourth node.

When a positive surge voltage is applied to the VDD1 input terminal 5, a current flows through the third resistor R24, and voltage drop is caused by the current and the third resistor R24. Accordingly, the second transistor 202 becomes conducting (is turned on). When the second transistor 202 becomes conducting (is turned on), the voltage Vdd is applied to a gate of the first transistor 130, so that the first transistor 130 becomes non-conducting (is turned off) or has a resistance value close to that in a non-conducting state. Accordingly, similarly to FIG. 6 described above, the potential at the VOUT output node 7 is suppressed to a breakdown potential of the high-speed circuit block A10 or lower.

Accordingly, even when a voltage steeply rising within, for example, 20 nanoseconds that is a predetermined time is applied, the voltage of the VOUT output node 7 to which one end of the first transistor 130 is connected can be suppressed. Consequently, a voltage applied to a circuit or the like in the high-speed circuit block A10 does not exceed a breakdown voltage, and the circuit or the like is protected.

While certain embodiments of the present invention have been described, these embodiments have been presented by way of example only, and are not intended to limit the scope of the invention. The novel embodiments described herein may be embodied in a variety of other forms, and various omissions, substitutions, and changes may be made without departing from the spirit of the invention. These embodiments and modifications thereof would fall within the scope and spirit of the invention, and would fall within the invention described in the accompanying claims and their equivalents.

The invention claimed is:

1. A power supply circuit comprising:
a first transistor connected between an input terminal and an output terminal;
a feedback voltage generation circuit configured to divide an output voltage to generate a feedback voltage;
a first voltage generation circuit configured to supply a voltage to a first control terminal of the first transistor via a first node based on the feedback voltage and a reference voltage; and
a protection circuit configured to, when an input voltage increases above a first threshold voltage within a predetermined time, output a voltage that makes the first transistor non-conducting or places the first transistor in a state where the first transistor has a predetermined resistance value, to the first control terminal,
wherein the protection circuit includes
a second transistor connected between the input terminal and the first node, and
a second voltage generation circuit configured to supply a voltage to a second control terminal of the second transistor in accordance with time change of the input voltage, and
wherein the second voltage generation circuit includes
a first capacitor connected between the input terminal and a second node,
a first resistor connected between the second node and a ground terminal,
a third transistor with a third control terminal connected to the second node, connected between the ground terminal and a third node, and
a second resistor connected between the input terminal and the third node, and wherein
the third node is connected to the second control terminal of the second transistor.

2. The circuit of claim 1, further comprising a fourth transistor in which a gate and a source are connected to the ground terminal and a drain is connected to the input terminal, wherein
the first threshold voltage is set to be lower than a snapback voltage of the fourth transistor, and
the protection circuit outputs the voltage that makes the first transistor non-conducting or places the first transistor in a state where the first transistor has the predetermined resistance value, to the first control terminal, when a potential at the second node reaches a first potential corresponding to the first threshold voltage.

3. The circuit of claim 1, wherein the second voltage generation circuit further includes a fifth transistor with a fifth control terminal connected to the second node, connected between the ground terminal and the output terminal.

4. The circuit of claim 3, wherein the first transistor, the second transistor, the third transistor, and the fifth transistor are configured as an integrated circuit, the integrated circuit includes a first element group and a second element group arranged to be closer to an end of the integrated circuit than the first element group, the first transistor is an element of the first element group, and at least either the third transistor or the fifth transistor is an element of the second element group.

5. The circuit of claim 1, wherein, when the input voltage increases above the first threshold voltage within the predetermined time, a voltage that makes the third transistor conducting or places the third transistor in a state where the third transistor has a predetermined resistance value is applied to the third control terminal in accordance with transition characteristics provided by a combination of the first capacitor and the first resistor.

6. A semiconductor device that modulates a logic signal input to a signal input terminal and outputs a demodulated logic signal from a signal output terminal, comprising a power supply circuit configured to supply an output voltage used for driving the semiconductor device, wherein the power supply circuit includes
a first transistor connected between an input terminal and an output terminal,
a feedback voltage generation circuit configured to divide the output voltage to generate a feedback voltage,
a first voltage generation circuit configured to supply a voltage to a first control terminal of the first transistor via a first node based on the feedback voltage and a reference voltage, and
a protection circuit configured to, when an input voltage increases above a first threshold voltage within a predetermined time, output a voltage that makes the first transistor non-conducting or places the first transistor in a state where the first transistor has a predetermined resistance value, to the first control terminal,
wherein the protection circuit includes
a second transistor connected between the input terminal and the first node, and
a second voltage generation circuit configured to supply a voltage to a second control terminal of the second transistor in accordance with time change of the input voltage, and
wherein the second voltage generation circuit includes a first capacitor connected between the input terminal and a second node, a first resistor connected between the second node and a ground terminal, a third transistor with a third control terminal connected to the second node, connected between the ground terminal and a third node, and a second resistor connected between the input terminal and the third node, and wherein the third node is connected to the second control terminal of the second transistor.

7. A power supply circuit supplying an output voltage between a first terminal and a second terminal, comprising:

a first transistor connected between a third terminal inputting an input voltage and the first terminal outputting the output voltage;

an electrostatic protection circuit connected between the third terminal and the second terminal, and configured to electrically conduct between the third terminal and the second terminal when a voltage between the third terminal and the second terminal exceeds a predetermined voltage; and a protection circuit configured to output a voltage that makes the first transistor non-conducting or places the first transistor in a state where the first transistor has a predetermined resistance value to a first control terminal of the first transistor via a first node, when the input voltage increases above a first threshold voltage within a predetermined time, wherein the first threshold voltage is set to be lower than the predetermined voltage, wherein the protection circuit includes a second transistor connected between the third terminal and the first node, and a second voltage generation circuit configured to supply a voltage to a second control terminal of the second transistor in accordance with time change of the input voltage, and wherein the second voltage generation circuit includes a first capacitor connected between the third terminal and a second node, a first resistor connected between the second node and the second terminal, a third transistor with a third control terminal connected to the second node, connected between the second terminal and a third node, and a second resistor connected between the third terminal and the third node, and wherein the third node is connected to the second control terminal of the second transistor.

8. The circuit of claim 7, wherein the second voltage generation circuit further includes a fifth transistor with a fifth control terminal connected to the second node, connected between the first terminal and the second terminal.

9. The circuit of claim 7, wherein a voltage that makes the third transistor conducting or places the third transistor in a state where the third transistor has a predetermined resistance value is applied to the third control terminal in accordance with transition characteristics provided by a combination of the first capacitor and the first resistor, when the input voltage increases above the first threshold voltage within a predetermined time.

10. A power supply circuit supplying an output voltage between a first terminal and a second terminal, comprising:

a first transistor connected between a third terminal inputting an input voltage and the first terminal outputting the output voltage;

an electrostatic protection circuit connected between the third terminal and the second terminal, and configured to electrically conduct between the third terminal and the second terminal when a voltage between the third terminal and the second terminal exceeds a predetermined voltage; and a protection circuit configured to output a voltage that makes the first transistor non-conducting or places the first transistor in a state where the first transistor has a predetermined resistance value to a first control terminal of the first transistor via a first node, when the input voltage increases above a first threshold voltage within a predetermined time, wherein the first threshold voltage is set to be lower than the predetermined voltage, wherein the protection circuit includes a second transistor connected between the third terminal and the first node, and a second voltage generation circuit configured to supply a voltage to a second control terminal of the second transistor in accordance with time change of the input voltage, and wherein the second voltage generation circuit includes a third resistor connected between the third terminal and a fourth node, and a second capacitor connected between the fourth node and the second terminal, and wherein the fourth node is connected to the second control terminal of the second transistor.

* * * * *